United States Patent
Gray et al.

(10) Patent No.: US 7,062,729 B2
(45) Date of Patent: Jun. 13, 2006

(54) METHOD AND SYSTEM FOR OBTAINING A FEASIBLE INTEGER SOLUTION FROM A HALF-INTEGER SOLUTION IN HIERARCHICAL CIRCUIT LAYOUT OPTIMIZATION

(75) Inventors: Michael S. Gray, Fairfax, VT (US); Jason D. Hibbeler, Williston, VT (US); Gustavo E. Tellez, Essex Junction, VT (US); Robert F. Walker, St. George, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/946,677

(22) Filed: Sep. 22, 2004

(65) Prior Publication Data

US 2006/0064661 A1     Mar. 23, 2006

(51) Int. Cl.
*G06F 17/50* (2006.01)
(52) U.S. Cl. ............................................ 716/3; 716/11
(58) Field of Classification Search .................... 716/1, 716/3, 11; 703/2, 14, 15
See application file for complete search history.

(56) References Cited

U.S. PATENT DOCUMENTS

| | | | | |
|---|---|---|---|---|
| 5,258,919 | A * | 11/1993 | Yamanouchi et al. | 716/11 |
| 5,794,242 | A * | 8/1998 | Green et al. | 707/10 |
| 6,031,984 | A * | 2/2000 | Walser | 703/2 |
| 6,189,132 | B1 * | 2/2001 | Heng et al. | 716/11 |
| 6,539,345 | B1 * | 3/2003 | Jones et al. | 703/15 |
| 6,816,825 | B1 * | 11/2004 | Ashar et al. | 703/14 |

OTHER PUBLICATIONS

Alexey Lvov, Fook-Luen Heng, "A graph based simplex method for the integer minimum perturbation problem with sum and difference constraints." Proceedings of the GLSVLSI-2004 ACM Symposium, Boston, MA, Apr. 2004, pp. 67-72.
*Random 2-SAT and Unsatisfiability* by Yann Verhoeven; ACM Information Processing Letters 72, Nov. 1999; pp. 119-123, Elsevier Science.
*A Linear-Time Algorithm For Testing The Trust of Certain Quantified Boolean Formulas*, by Bengt Aspvall, Michael F. Plass and Robert Endre Tarjan; Information processing Letters, vol. 8, No. 3, Mar. 1979, pp. 121-123, 195.

\* cited by examiner

*Primary Examiner*—Stacy A. Whitmore
*Assistant Examiner*—Binh Tat
(74) *Attorney, Agent, or Firm*—Downs Rachlin Martin PLLC (57) ABSTRACT

A method (300) and system (500) for optimizing a circuit layout based on layout constraints (308) and objectives (312). The method includes solving a linear program so as to obtain a rational solution whose variables are either whole or half integer. The tight constraints and objectives involving variables whose solution are a half integer are reduced to a 2-SAT problem, which is analyzed to determine its satisfiability. If the 2-SAT problem is not satisfiable, one or more objectives are removed so as to make the 2-SAT problem satisfiable. Any half-integer results of the linear program are rounded according to the truth assignment that satisfies the 2-SAT problem. The rounded results are used to create the circuit layout.

17 Claims, 6 Drawing Sheets

METHOD AND SYSTEM FOR OBTAINING A FEASIBLE INTEGER SOLUTION FROM A HALF-INTEGER SOLUTION IN HIERARCHICAL CIRCUIT LAYOUT OPTIMIZATION

FIELD OF THE INVENTION

The present invention generally relates to the field of hierarchical circuit layout optimization involving 2-variable sum and difference constraints and objectives. In particular, the present invention is directed to a method and system for obtaining a feasible integer solution from a half-integer solution in circuit layout optimization when no integer solution exists to the optimization problem.

BACKGROUND OF THE INVENTION

Given a particular physical design for an integrated circuit, it is sometimes necessary to manipulate and modify elements of the circuit for any one or more of a variety of reasons, such as performing a scaling, an area compaction or a migration of one set of manufacturing design, or "ground," rules to a different set of ground rules. Efficient techniques for performing such manipulations and modifications utilize a piecewise linear program (LP) and 2-variable difference and/or 2-variable sum constraints and objectives. Examples of such techniques are disclosed in U.S. Pat. No. 6,189,132, which is incorporated herein by reference. The principal requirement of any layout modification is that the resultant edge and usage locations must be integral, since the database underlying the physical design and the downstream fabrication tools require these locations to be represented by integers.

The presence of hierarchy in a design complicates the problem of layout optimization. In addition, designs in which elements appear in both mirrored and non-mirrored forms change the fundamental nature of the underlying optimization problem. In this case, the optimal solution to the LP might include half-integers. An arbitrary rounding of half integers to whole integers can potentially lead to an infeasible solution, i.e., a solution in which some of the constraints of the original problem are violated. In the context of layout optimization, these constraints encode connectivity information and ground rules already met in the layout. Consequently, arbitrary rounding in this context can produce a layout having electrical opens, shorts or ground-rule violations that did not exist in the layout.

In general, it is not possible to represent all of the desired relationships, i.e., objectives, as constraints and still obtain a feasible solution. In the presence of constraints and objectives, the rounding of a feasible half-integer solution to a feasible integer solution is a possibly non-satisfiable problem. The treatment of such a problem as an integer LP (ILP), in which all intermediate values in the optimization are kept as integers, is also an NP-complete problem and is not solvable in the sense that an optimal solution is guaranteed.

A typical migration using techniques disclosed in U.S. Pat. No. 6,189,132 involves scaling an entire layout from a source technology by some scale factor and then using an LP to fix any ground rule errors in the target technology according to the target technology's ground rules. For many edge relationships (for example metal to metal spacing) the relationship is ground rule correct in the target technology after the scaling has been applied. In this case a constraint is made so that this ground rule correct relationship cannot be broken. When a ground rule in the target technology is not met an objective is made. Constraints are also made for among other things electrical connectivity as stated above. Since every constraint in the LP is met by construction the initial layout before optimization represents a feasible integer solution.

It is quite possible that there is no solution to the LP that fixes all of the ground rule violations. However with the encoding of ground rules already met in the target technology as constraints no new ground rule errors can be introduced. An objective not met represents a ground rule that is not able to be fixed. Rounding must be done in such a way that a feasible solution is still guaranteed. This requires that no constraint be violated or in other words that no ground rule errors are introduced which would result in an infeasible solution to the LP.

When no feasible integer solution can be reached from the rational solution of an LP containing half-integers, which satisfies all the constraints and meets the same set of objectives; a near optimal integer result is still desired which leaves the layout as ground rule correct as possible. This greatly reduces the amount of manual effort required to get a layout ground-rule clean. Ground rule errors that result because of the restriction that the solution be integer can ultimately be fixed by manual efforts. Consequently, it would be desirable to have a technique for efficiently guaranteeing a feasible solution to such general linear programs and producing near-optimal integer solutions.

SUMMARY OF THE INVENTION

In one aspect, the present invention is directed to a method of creating a circuit layout based on a plurality of constraints and at least one objective. The method comprises the steps of constructing a Boolean satisfiability problem containing a plurality of constraints and at least one objective. It is determined if the at least one objective renders the Boolean satisfiability problem unsatisfiable. If the at least one objective renders the Boolean satisfiability problem unsatisfiable, the at least one objective is removed so as to form a reduced Boolean satisfiability problem. A circuit layout is created as a function of the reduced Boolean satisfiability problem.

In another aspect, the present invention is directed to a computer readable medium containing computer instructions for creating a circuit layout based on a plurality of constraints and at least one objective. The computer instructions comprise a first set of instructions for constructing a Boolean satisfiability problem containing a plurality of constraints and a plurality of objectives. A second set of instructions is for determining if at least one of the plurality of objectives renders the Boolean satisfiability problem unsatisfiable. A third set of instructions is for removing at least one of the plurality of objectives so as to form a reduced Boolean satisfiability problem. A fourth set of instructions is for creating a circuit layout as a function of the reduced Boolean satisfiability problem.

In a further aspect, the present invention is directed to a system comprising at least one computer processor and at least one memory device operatively coupled to the at least one computer processor. The at least one memory device contains computer instructions for creating a circuit layout based on a plurality of constraints and a plurality of objectives. The computer instructions comprise a first set of instructions for constructing a Boolean satisfiability problem containing a plurality of constraints and a plurality of objectives. A second set of instructions is for determining if at least one of the plurality of objectives renders the Boolean satisfiability problem unsatisfiable. A third set of instructions is for removing at least one of the plurality of objectives so as to form a reduced Boolean satisfiability problem. A fourth set of instructions is for creating a circuit layout as a function of the reduced Boolean satisfiability problem.

BRIEF DESCRIPTION OF THE DRAWINGS

For the purpose of illustrating the invention, the drawings show a form of the invention that is presently preferred. However, it should be understood that the present invention is not limited to the precise arrangements and instrumentalities shown in the drawings, wherein.

DETAILED DESCRIPTION OF THE DRAWINGS

Generally, the present invention is directed to a method and system for rounding from a feasible, optimal (or near-optimal) half-integer solution to a feasible optimal (or near-optimal) integer solution using a Boolean satisfiability problem, e.g., a two-satisfiability (2-SAT) problem, in the presence of unsatisfiability. A method and system of the present invention may be used to optimize layouts of various types of circuits, e.g., semiconductor integrated circuits, containing elements that are subject to practically any number of constraints that must be satisfied and practically any number of objectives that are desired to be satisfied.

As mentioned briefly in the Background section above, objectives typically correspond to ground rules that are not met in the target technology. For example, in the context of migrating a circuit design laid out in accordance with ground rules of a first fabrication process to a second fabrication process having a second, different set of ground rules, the objectives that are desired to be satisfied may correspond to a set, or subset, of ground rule violations in the target fabrication process. Examples of objectives include minimum spacing, minimum width, space perturbation and location perterbation, among others. Constraints, on the other hand, are conditions that must be met. Examples of constraints include electrical connectivity and ground rules that are already met, among others. If any one or more of the constraints are not met, the resulting circuit could have electrical opens or shorts or new ground rule violations. Those skilled in the art will readily appreciate that the foregoing examples are merely illustrative and by no means exhaustive.

Figure 1A:
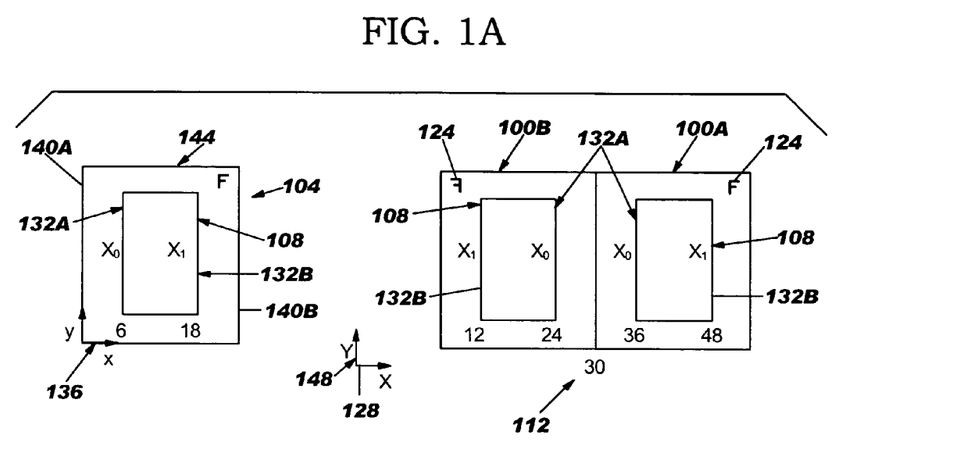
FIG. 1A is a plan view of a circuit cell and a layout containing two mirrored instances of the circuit cell.
Figure 1B:
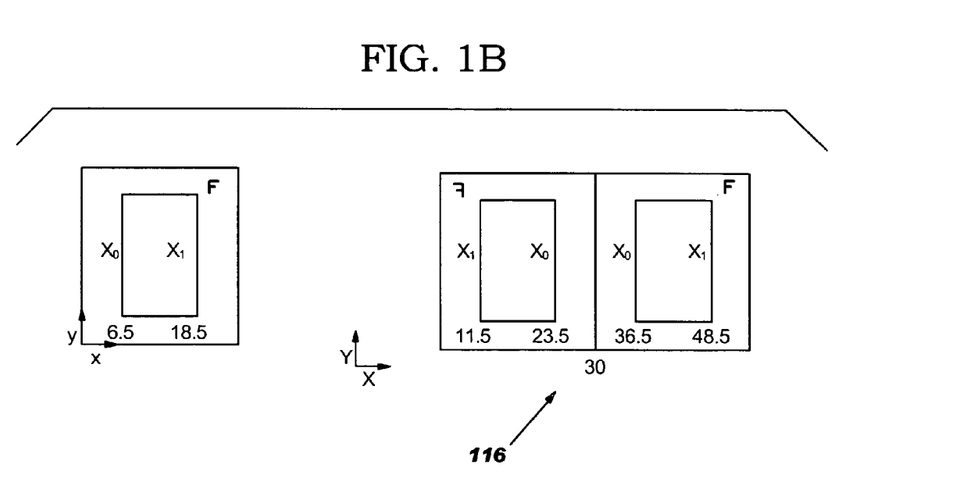
FIG. 1B is a plan view of the circuit cell and layout of FIG. 1A based on a rational solution to a linear optimization program.
Figure 1C:
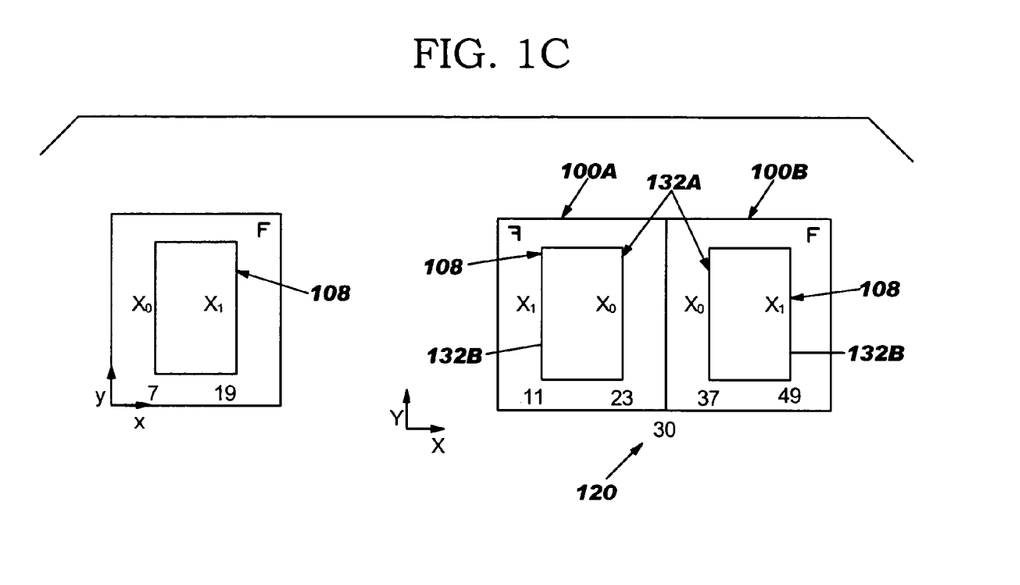
FIG. 1C is a plan view of the circuit cell and layout of FIG. 1A based on a rounding of the rational solution of FIG. 1B.

Referring now to the drawings, FIGS. 1A–1C illustrate generally various concepts of the present invention relative to two circuit elements, in this case two mirrored instances 100A, 100B of a cell 104 containing an M1 (i.e., Metal layer 1) shape 108. Generally, FIG. 1A illustrates a layout 112 of mirrored instances in accordance with a first fabrication process, FIG. 1B illustrates an optimized layout 116 based on a rational, in this case half-integer, solution to optimization conditions imposed by ground rules of a second fabrication process and FIG. 1C illustrates an optimized layout 120 rounded to integers as required by the databases and tools of the second fabrication process. It is noted that the placement orientations of mirrored instances 100A, 100B are indicated by orientation identifier 124.

In the example of FIGS. 1A–1C, the optimization direction is along the global X direction 128, which for convenience may be considered to extend horizontally. Consequently, the vertical edges 132A, 132B of M1 shape 108 under consideration may be labeled, respectively, "$X_0$" and "$X_1$" as shown, and the integer locations of the edges may be identified relative to a local coordinate system 136 of cell 104. Edge 132A is located at x=6 and edge 132B is located at x=18. Edges 140A, 140B of the boundary 144 of cell 104 are each spaced 6 units outward from a corresponding one of edges 132A, 132B. Consequently, edge 140A of boundary 144 is located at local x=0 and edge 140B is located at local x=24. When placed side-by-side, edges 132A, 132B of M1 shape 108 may be located relative to a global coordinate system 148. In this example, the Y-axis of global coordinate system 148 is located 6 units to the left of edge 140B of boundary 144 of mirrored instance 100B. Consequently, the global-X locations of edges 132A, 132B of mirrored instances 100A, 100B are as shown in FIG. 1A.

The conditions for optimizing layout 120 of mirrored instances 100A, 100B of FIG. 3C consists of two constraints and one objective. The two constraints are that the width of M1 shape 108 of each mirrored instance 100A, 100B along the global-X direction be greater than or equal to 12 units. For example, 12 units may correspond to the minimum width of M1 shape 108 needed to ensure that the electrical properties of the M1 shape meet their design requirements. These constraints may be represented by the inequalities, $X_1+(-)X_0 \geq 12$ and $(-)X_0+X_1 \geq 12$. The one objective is that the desired spacing between M1 shapes 108 of the two instances 100A, 100B is greater than or equal to 13 units. This objective may be represented by the inequality, $X_0+X_0 \geq 13$.

Solving an LP (not shown) for a rational solution (which in this case includes half-integer solutions) yields the locations of edges 132A, 132B shown in FIG. 1B. Those skilled in the art are readily familiar with LPs and techniques for solving LPs, such that further explanation is not necessary for those skilled in the art to practice the present invention.

Once a rational solution to the LP has been obtained, any half-integer results are, or attempted to be, rounded up or down to an appropriate integer. As discussed in more detail below, this rounding may involve reducing the tight constraint and objective inequalities which involve variables whose result is half integer to a Boolean satisfiability problem. In this case, since each of the tight inequalities includes no more than two variables, the tight inequalities may be reduced to a 2-SAT problem. Although 2-SAT techniques are well known in the art, for the sake of completeness some of the basic concepts of 2-SAT problems are reviewed here.

Generally, a 2-SAT problem involves determining whether a set of clauses, each containing disjunctive pairs of Boolean variables, in conjunctive normal form wherein is satisfiable by a truth assignment. In other words, a 2-SAT problem is satisfied when a truth assignment may be made to all of the Boolean variables of all of the disjunctive clauses that renders the entire set of conjunctive clauses true. More generally, a 2-SAT problem arises from the equation $$F=(Q_1X_1Q_2X_2 \ldots Q_nX_n)C$$

in which each $Q_i$ is a quantifier, each $X_i$ is a Boolean variable and C is a conjunction of clauses each containing a disjunction of literals, when (1) each $Q_i$ is an existential quantifier, (2) each disjunction clause contains two literals and each literal is either a variable ($X_i$) or the negation of the variable ($X_i$). If C is satisfiable, then any variable having a truth assignment of TRUE is rounded up and any variable having a truth assignment of FALSE is rounded down. If, on the other hand, C is not satisfiable, further operations (discussed below) may be performed to find a near optimal solution to the LP.

Returning to the example of FIGS. 1A–1C, the tight constraint and objective inequalities may be reduced to the 2-SAT problem, $C_{red}=(X_1 \lor \overline{X}_0)^{\smallfrown}(\overline{X}_0 \lor X_1)^{\smallfrown}(X_0 \lor X_0)$. The truth assignment that satisfies $C_{red}$ is $X_0$=TRUE and $X_1$=TRUE. Consequently, the values of variables ($X_0$, $X_1$) are rounded up from (6.5, 18.5) to (7, 19), as shown in FIG. 1C. It is noted that both constrains are met, as is the objective that the distance between M1 shapes 108 of mirrored instances 100A, 100B be equal to or greater than 13. This is so because 37 minus 23, i.e., the distance between confronting edges 132A of M1 shapes 108 of the two mirror instances 100A, 100B in FIG. 1C, equals 14, which is greater than 13. Consequently, layout 120 of FIG. 1C has been optimized in accordance with the constraints and objective.

Figure 2A:
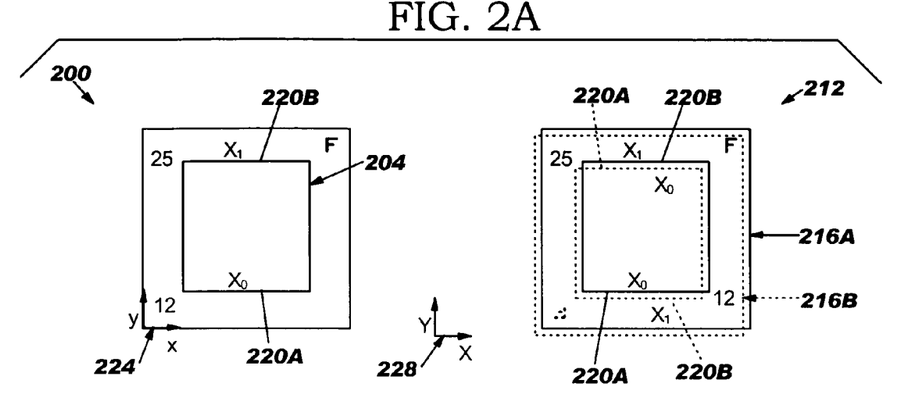
FIG. 2A is a plan view of a circuit cell and a layout containing two instances of the circuit cell arranged one on top of the other and one rotated 180° relative to the other.
Figure 2B:
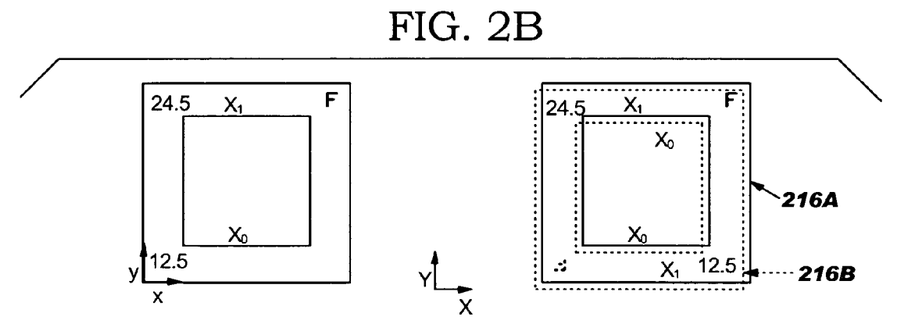
FIG. 2B is a plan view of the circuit cell and layout of FIG. 2A based on a rational solution to a linear optimization program.
Figure 2C:
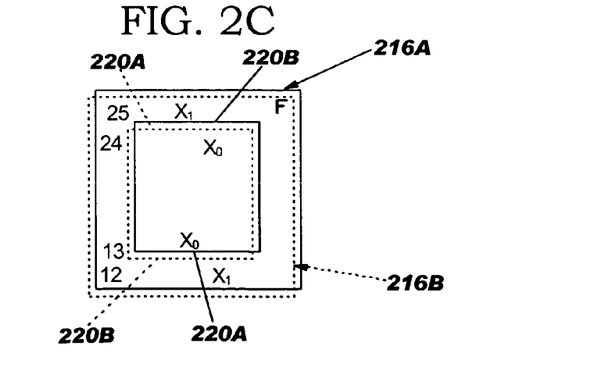
FIG. 2C is a plan view of the layout of FIG. 2A when rounding of the rational solution is attempted.

Whereas FIGS. 1A–1C present a layout optimization example in which the Boolean satisfiability problem is satisfiable in accordance with all of the necessary and desired conditions, FIGS. 2A–2C illustrate an example in which the Boolean satisfiability problem is not satisfiable for all of the conditions. FIG. 2A shows a cell 200 containing a via shape 204 (which is typically required to be square so that its height and width must be the same) and a boundary 208 and also shows an original layout 212 in which two instances 216A, 216B of the cell are placed one over the other and such that one is rotated 180° relative to the other. The "horizontal" edges 220A, 220B of via shape 204 are designated $X_0$ and $X_1$, respectively, and are correspondingly located at y=12 and y=25 relative to a local coordinate system 224. Coincidentally, the X-axis of global coordinate system 228 of original layout 212 is coincident with the x-axis of local coordinate system 224 of the un-rotated instance 216A of cell 200 in the original layout, such that edge 220A of the un-rotated instance and edge 220B of rotated instance 216B are both located at Y=12 and edge 220B of the un-rotated instance and edge 220A of the rotated instance are both located at Y=25. In this example, the constraints for migrating original layout 212 to a new layout are $X_0+X_1 \geq 37$, $(-)X_0+(-)X_1 \geq -37$ and $(-)X_0+X_1 \geq 12$. One ground rule exists in which it is desired to force the distance between edges of each instance of via shape 204 to be equal to 12, i.e., $12 \geq$ via width $\geq 12$. This ground rule may be represented by the objective, $(-)X_1+X_0 \geq -12$.

FIG. 2B illustrates a rational solution to the LP, which is based upon the foregoing constraints and objective. As seen in FIG. 2B, the rational solution is that ($X_0$, $X_1$) of un-rotated instance 216A equals (12.5, 24.5) and that ($X_1$, $X_0$) of rotated instance 216B equals (12.5, 24.5). As discussed above, however, solutions must be integral, so that the problem becomes determining whether or not the rational solution may be rounded while satisfying all of the conditions. Again, this may be done by reducing the conditions to a Boolean satisfiability problem.

Reducing the foregoing constraints and objectives to a 2-SAT problem yields $C=(X_0 \lor X_1)^{\smallfrown}(\overline{X}_0 \lor X_1)^{\smallfrown}(\overline{X}_0 \lor X_1)^{\smallfrown}(X_1 \lor X_0)$. This problem is not satisfiable. The truth assignment is unassignable because the literal and negation of the literal for the variables $X_0$ and $X_1$ would receive the same truth assignment. As discussed below in more detail, this is so because in a corresponding directed graph the variables and their negations end up in the same strongly connected component. By inspection, it can be seen that there is no whole-integer solution. If both $X_0$ and $X_1$ are rounded down, as shown in FIG. 2C both edges 220A, 220B of the un-rotated instance 216A will move down, but the same edges of rotated instance 216B move up. A similar situation results from rounding up both $X_0$ and $X_1$. In addition, if one of $X_0$ and $X_1$ is rounded up and the other is rounded down the ground rule that the distance between edges 220A, 220B, or width, equal 12 would be violated. Rounding $X_0$ up and $X_1$ down would result in the width of via shape being 11, and rounding $X_0$ down and $X_1$ up would result in the width being 13.

An integral feasible solution of the LP may be achieved by removing the objective condition. Removing the objective leaves the Boolean satisfiability problem, $C=(X_0 \lor X_1)^{\smallfrown}(\overline{X}_0 \lor \overline{X}_1)^{\smallfrown}(\overline{X}_0 \lor X_1)$, which is satisfied by the truth assignments, $X_0$=FALSE and $X_1$=TRUE. Consequently feasible integral solution is achieved by rounding down $X_0$ and rounding up $X_1$. This rounding results in the original layout 212 shown in FIG. 2A in which edge 220A of un-rotated instance 216A and edge 220B of rotated instance 216B are both located at Y=12 and edge 220B of the un-rotated instance and edge 220A of the rotated instance are both located at Y=25.

While the examples of FIGS. 1A–1C and 2A–2C are highly simplified in order to illustrate some underlying principals of a circuit layout optimizing method of the present invention, these same principals may be applied to much more complex layouts, such as very large scale integration (VLSI) and other circuit layouts containing hundreds, thousand or millions of conditions.

Figure 3:
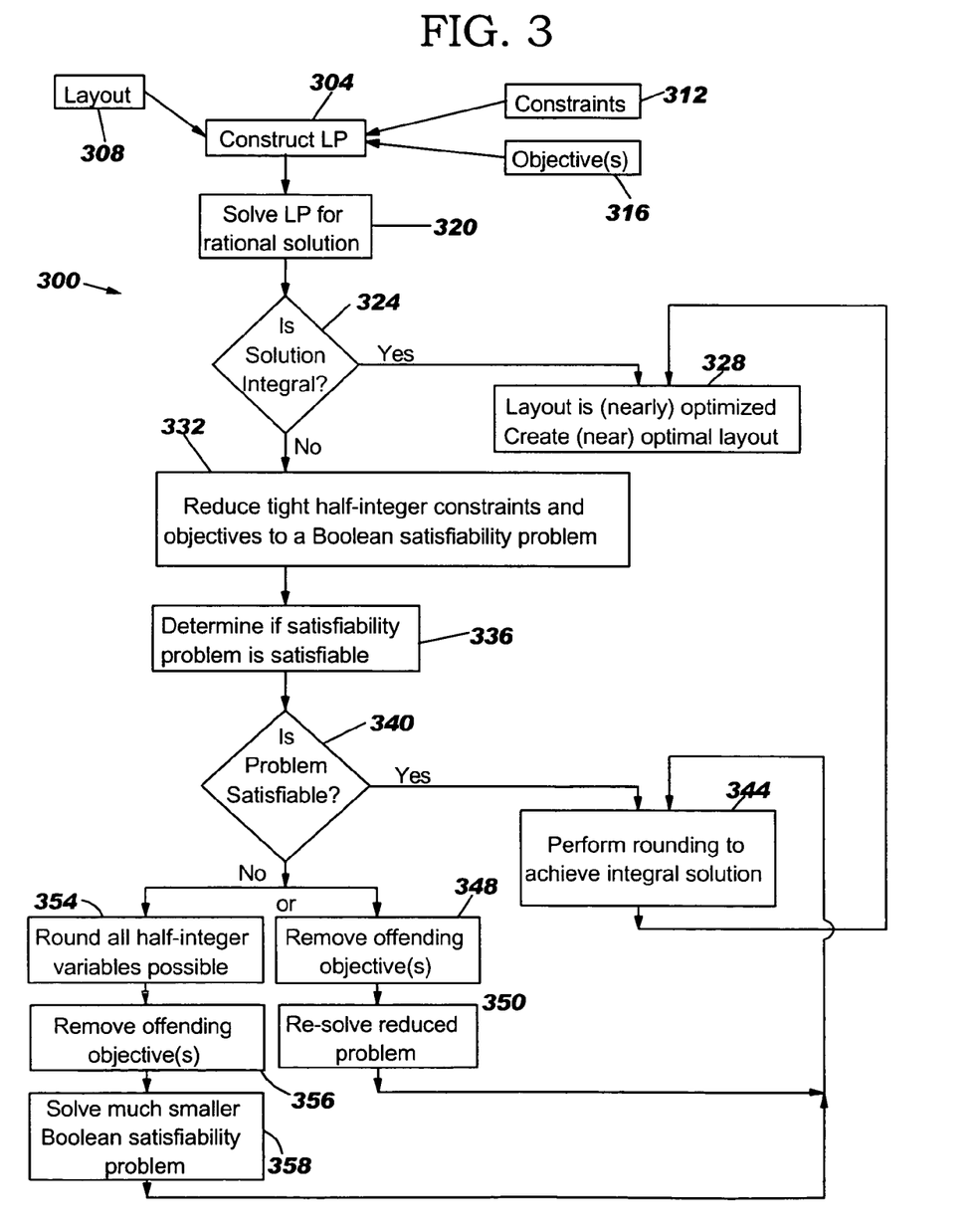
FIG. 3 is a flow diagram illustrating a layout optimization method of the present invention.

FIG. 3 illustrates one embodiment of a circuit layout optimizing method 300 according to the present invention. At step 304, an LP may be constructed based upon a particular layout 308, a set of constraints 312 and at least one objective 316. Again, constraints are conditions that must be met, and objectives are conditions that are desired to be met. Although method 300 requires the LP to have at least one objective, it would typically have hundreds, thousands or more objectives each of which is desired, but not necessary to meet. As will become apparent below, an important aspect of the method lies in this fact that objectives need not be met for a feasible integral solution to be guaranteed. The construction of LPs in the context of circuit layout is well known and need not be described in any detail herein for those skilled in the art to practice the present invention to its fullest scope.

At step 320, the LP may be solved in any conventional manner so as to achieve a rational solution. For example, when constraints and objectives are modeled by through pairs of variables, depending upon the constraints and objectives, the rational solution of the LP may contain all integers, all half-integers or a mix of integers and half-integers. At step 324 it is determined whether or not the solution of the LP is entirely integral. If so, the layout is optimized and method 300 may proceed to creating the optimized layout at step 328. However, if the solution contains half-integers, method continues to step 332 wherein constraints and objective(s) are reduced to a Boolean satisfiability problem.

For example, if constraints and objective(s) contain only pairs of variables, they may be reduced to a 2-SAT problem in a manner similar to the manner described above in connection with the examples of FIGS. 1A–1C and 2A–2C. Of course, for real-world layouts, the Boolean satisfiability problem will contain many more conjunctions than illustrated above. However, the underlying principals remain the same no matter how many constraints and objectives are involved. At step 336, the Boolean satisfiability problem may be analyzed, and at step 340 it may be determined whether or not the problem is satisfiable with a truth assignment.

Figure 4:
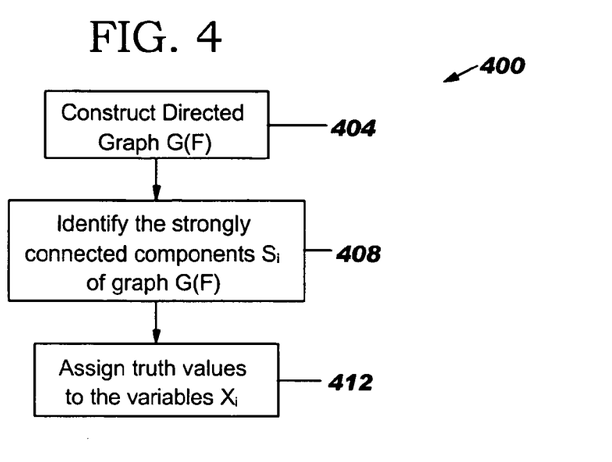
FIG. 4 is a flow diagram illustrating an algorithm for determining the satisfiability of a 2-SAT satisfiability problem that may be used in connection with the method of FIG. 3.

One method of analyzing and determining the satisfiability of a 2-SAT problem is shown in FIG. 4. In general, unsatisfiability in the context of method 300 means that no whole integer solution satisfying all conditions can be rounded to from a half-integer solution. As mentioned above, unsatisfiability exists in a 2-SAT problem when a literal and the negation of a literal end up in the same strongly connected component. Presence of a literal and its negative in the same strongly connected component requires that the same variable be rounded up and down at the same time. Of course, this is not possible. FIG. 4 illustrates an algorithm 400 for determining whether a 2-SAT problem is satisfiable. Algorithm 400 is based on the linear-time algorithm proposed by Robert Endre Tarjan et al. in the publication "A Linear-Time Algorithm For Testing The Truth Of Certain Quantified Boolean Formulas," Information Processing Letters, vol. 8, no. 3, March, 1979, which is incorporated herein in its entirety.

Referring now to FIG. 4, algorithm 400 essentially comprises three primary steps: (1) step 404 of constructing a directed graph (G(F)) of the 2-SAT problem (C); (2) step 408 of identifying the strongly connected components of the graph and (3) step 412 of assigning truth values to the n variables $X_i$. Each of these steps is described below in detail.

At step 404, the directed graph is constructed with 2n vertices and 2|C| edges. For every $X_i$, vertices $X_i$ and $\overline{X}_i$ are added to the graph. $X_i$ and $\overline{X}_i$ are complements of each other. For each disjunctive clause (u∨v) of C, edges $\overline{u}{\rightarrow}v$ and $\overline{v}{\rightarrow}u$ are added to the graph.

At step 408, the strongly connected components of the directed graph are identified. A strongly connected component, or strong component (S), of a directed graph G=(V, E) is a maximal set of vertices U belonging to the set V of vertices that for every set of vertices u and v in U, vertices u and v are reachable from each other, i.e., u→v and v→u. Every strong component S of the directed graph has a dual component $\overline{S}$ induced by the complements of the vertices in that strong component. It is possible that S=$\overline{S}$.

The identification of strongly connected components may proceed as follows. First, a depth-first search (DFS) is performed on G to compute the finishing times f[u] for each vertex u. Then, the transpose of G, i.e., $G^T$, is computed by swapping the directions of all edges. A DFS is performed on $G^T$ by performing the DFS in the order of finishing times f[u] previously established. The vertices of each tree in the depth-first forest of the immediately previous step are output as separate strongly connected components.

At step 412, truth values are assigned to the variables. An assignment corresponds to a set of truth values for the variables that make C true if and only if: (1) for all i, vertices $X_i$ and $\overline{X}_i$ receive complementary truth values and (2) no edge u→v has u assigned TRUE and v assigned FALSE, i.e., no path leads from a TRUE vertex to a FALSE vertex. The theorem is that C is satisfiable if and only if in G(F) no vertex $U_i$ is in the same strong component S as its complement, $\overline{U}_i$, i.e., S≠$\overline{S}$. Truth values are assigned as follows. Processing the strong components S of the directed graph G(F) in reverse topological order, (1) if S is marked, i.e., already has an truth assignment from earlier marking, do nothing, (2) if S=$\overline{S}$, stop, (3) otherwise, mark S as TRUE and $\overline{S}$ as FALSE. Examples of algorithm are presented below in connection with FIGS. 5 and 6.

Returning to method 300 of FIG. 3, if at step 340 it is determined that the Boolean satisfiability problem is satisfiable, at step 344 each half-integer value of the rational solution of the LP may be rounded up if the truth assignment of the corresponding variable is TRUE and each half-integer value of the rational solution of the LP is rounded down if the truth assignment of the corresponding variable is FALSE. After rounding, the layout is optimized and method 300 may then create the optimized layout at step 328. However, if at step 340 it is determined that the Boolean satisfiability problem is not satisfiable, method 300 may proceed to steps 348 and 350 at which one or more objectives that involve variables that cannot be assigned valid truth assignments are removed from the problem and the reduced problem is re-solved. Alternatively, method 300 may proceed to steps 354, 356 and 358 at which all possible half-integer variables are rounded, the offending objectives are removed and the now reduced, much smaller Boolean satisfiability problem is solved.

Since by construction the initial layout is a feasible integer solution to the LP, it must be from an objective that a rational solution involving half-integers arises. Determining which objectives to remove involves determining which variables cannot have a truth assignment from the Boolean satisfiability problem constructed from the tight constraint and objective inequalities. This is accomplished with the following modification to step 412 in algorithm 400. A strongly connected component is assigned either TRUE or FALSE as described, However, if S=$\overline{S}$, the algorithm assigns UNASSIGNABLE and continues. The output to the Boolean satisfiability problem is now (1) satisfiable with truth assignments for all variables from which the rounding can be performed (2) not-satisfiable with truth assignments for the variables that can be assigned and thus rounded and UNASSIGNABLE for the ones that cannot.

By removing a subset (or the entire set) of the set of objectives whose variables could not be assigned, a Boolean satisfiability problem can be constructed that is satisfiable. As stated before, removing an objective cannot cause a ground rule violation to be created. It can only cause a ground rule violation to not be fixed that was able to fixed with a rational solution containing half integers. There are several techniques that may be used for removing objectives and subsequently determining a near-optimal solution.

For example, all the objective(s) involving variables that cannot be assigned may be removed from the Boolean satisfiability problem so as to create a reduced Boolean satisfiability problem, which may then be solved. This is shown at step 348 of method 300 of FIG. 3. Alternatively, the variables having a truth assignment may be rounded immediately, as indicated at step 354 of method 300. This is possible because removing objectives from the problem can only break apart strongly connected components where $S=\overline{S}$. The set of strongly connected components that could have a truth value assigned does not change and their truth assignments cannot change. Then, the much smaller Boolean satisfiability problem of the variables that cannot be rounded may be re-solved with all of the objectives that involved the variables that did not have a truth assignment removed. A variation is to use this alternative but remove the smallest set of objectives involving the variables that have no truth assignment so as to make the Boolean satisfiability problem satisfiable. After rounding at step 348, method 300 may proceed to step 328 at which a near-optimal layout is created.

A layout optimizing method of the present invention, such as layout optimizing method 300 of FIG. 3, has a number of advantages over prior art layout techniques involving Boolean satisfiability problems. In general, when a prior art satisfiability problem has no solution, there is no groundrule cleanup. That is, there is no systematic way of determining which objectives should be removed so as to achieve a near optimal layout. In addition, by removing the objectives involving variables that do not have a valid truth assignment no new ground rule violations are created because no constraints were removed from the satisfiability problem. Moreover, using a layout optimization method of the present invention achieves the best rounding that fixes the most ground rule violations.

Figure 1D:
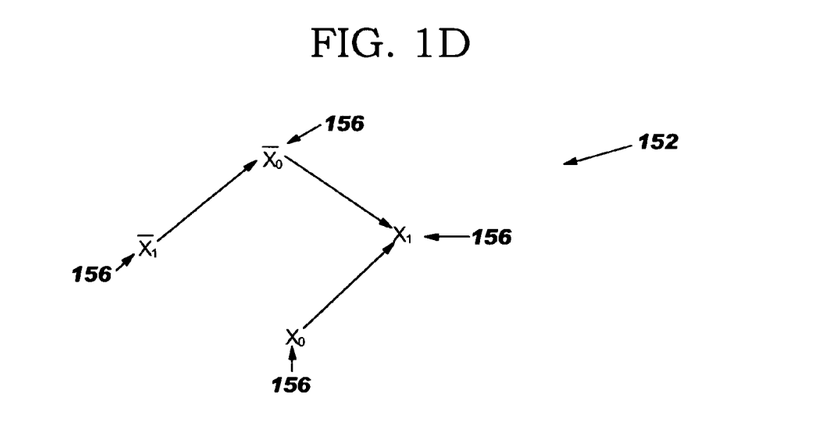
FIG. 1D is a directed graph of a Boolean expression containing the constraint and objectives used to create the layout of FIG. 1C.

Following are continuations of the examples of FIGS. 1A–1C and 2A–2C implementing algorithm 400 of FIG. 4 and certain steps of layout optimization method 300 of FIG. 3 in order to illustrates some aspects of the present invention, such as determining the satisfiability of the Boolean expression C in a systematic manner that is readily expandable to accommodate very large expressions containing may disjunctives. Referring to FIG. 1D, and also to FIGS. 1A–1C, 3 and 4, FIG. 1D shows a directed graph 152 derived from the expression $C=(X_1 \vee \overline{X}_0) \wedge (\overline{X}_0 \vee X_1) \wedge (X_0 \vee X_0)$ in accordance with step 404 of the 2-SAT algorithm 400. The next step of algorithm, step 408, is to determine the strongly connected components. By inspection, in this example each vertex 156 in graph 152 is a strongly connected component because there are no cycles in the graph. Next, still at step 408, a DFS is performed on the strongly connected component graph (which is identical to the vertex graph since each vertex is a its own strongly connected component) so as to determine the finishing times. At step 412, truth values are assigned to the strongly connected components assigning TRUE to each S and FALSE to each $\overline{S}$. The results are shown in Table I and are the same as described above in connection with FIGS. 1A–1C. At step 352 of layout optimizing method 300, the half-integer solutions for $(X_0, X_1)$ of (6.5, 19) are both rounded up to (7, 19) because each assignment to $X_0$ and $X_1$ is TRUE. After rounding, layout optimization method 300 may proceed to step 328, creating the optimized layout.

TABLE I

| $X_0$ | $\overline{X}_0$ | $X_1$ | $\overline{X}_1$ |
|---|---|---|---|
| $S_2$ TRUE | $S_1$ FALSE | $S_3$ TRUE | $S_0$ FALSE |

Figure 2D:
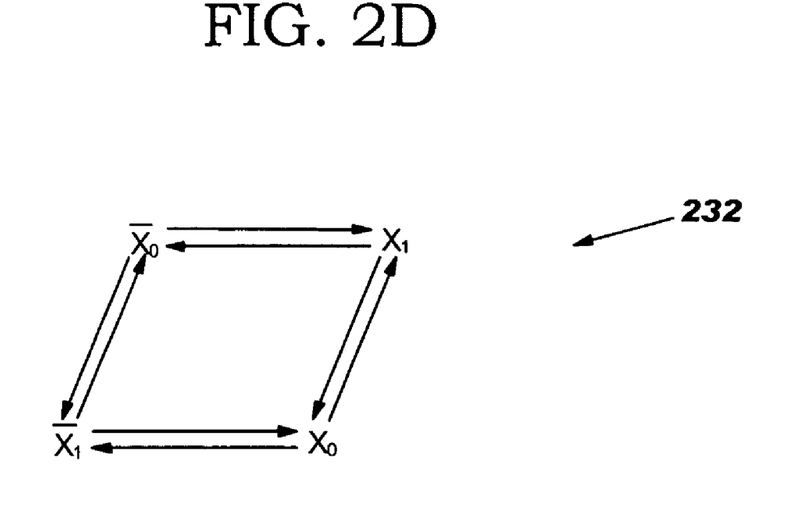
FIG. 2D is a directed graph of an unsatisfiable Boolean expression containing the constraint and objectives used to obtain the rational solution of FIG. 2B.

Referring now to FIG. 2D, and also to FIGS. 2A–2C, 3 and 4, FIG. 2D shows a directed graph 232 derived from the expression $C=(X_0 \vee X_1) \wedge (\overline{X}_0 \vee \overline{X}_1) \wedge (X_0 \vee X_1) \wedge (\overline{X}_1 \vee X_0)$ in accordance with step 404 of the 2-SAT algorithm 400. The next step of algorithm, step 408, is to determine the strongly connected components. By inspection, in this example there is only one strongly connected component, since for every pair of vertices u and v in directed graph, vertices u and v are reachable from each other, i.e., u→v and v→u. At step 412, an assignment of truth values is attempted. The expression C is satisfiable if an only if no vertex $U_j$ is in the same strong component as its complement, $\overline{U}_j$. However, since every vertex belongs to the same strongly connected component $S_1$, this statement is not true. Consequently, C is unsatisfiable. Table II illustrates the presence of all vertices in the same strong component $S_1$.

TABLE II

| $X_0$ | $\overline{X}_0$ | $X_1$ | $\overline{X}_1$ |
|---|---|---|---|
| $S_1$ | $S_1$ | $S_1$ | $S_1$ |

Figure 2E:
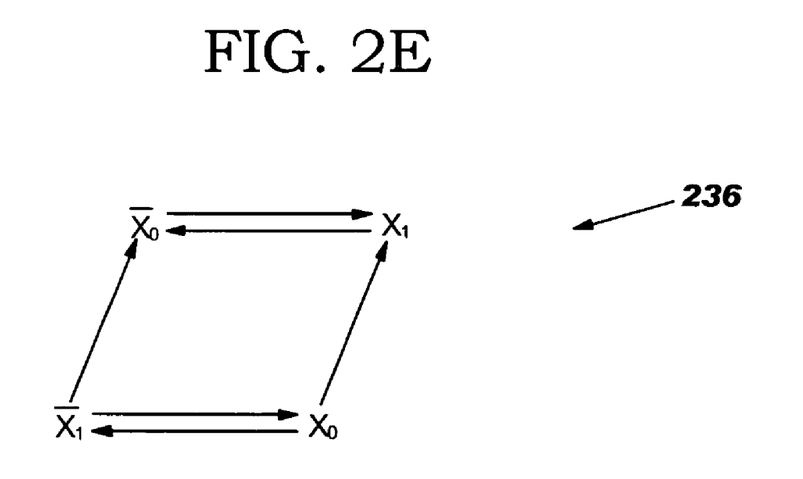
FIG. 2E is a directed graph of a satisfiable, reduced Boolean expressing containing only the constraints used to obtain the rational solution of FIG. 2B.

Since C is unsatisfiable, the objective may be removed at step 348 of layout optimizing method of FIG. 3, leaving the reduced expression $C_{red}=(X_1 \vee \overline{X}_0) \wedge (\overline{X}_0 \vee X_1) \wedge (X_0 \vee X_0)$. FIG. 2E illustrates a directed graph 236 resulting from $C_{red}$ that may be made at step 404 of algorithm 400 of FIG. 4. At step 408, the strongly connected components are determined. In this example, by inspection two strongly connected components $(S_0, S_1)$ exist.

Next, and still at step 408, a DFS may be performed on the strongly connected component graph (not shown) so as to determine the finishing times. At step 412, truth values are assigned to the strongly connected components, assigning TRUE to each S and FALSE to each $\overline{S}$. The results are shown in Table III and are the same as described above in connection with FIGS. 2A–2C. At step 352 of layout optimizing method 300, the half-integer solutions for $(X_0, X_1)$ of (6.5, 18.5) are both rounded up to (7, 19) because each assignment to $X_0$ and $X_1$ is TRUE. After rounding, layout optimization method 300 may proceed to step 328, creating the optimized layout.

TABLE III

| $X_0$ | $\overline{X}_0$ | $X_1$ | $\overline{X}_1$ |
|---|---|---|---|
| $S_0$ FALSE | $S_1$ TRUE | $S_1$ TRUE | $S_0$ FALSE |

Figure 5:
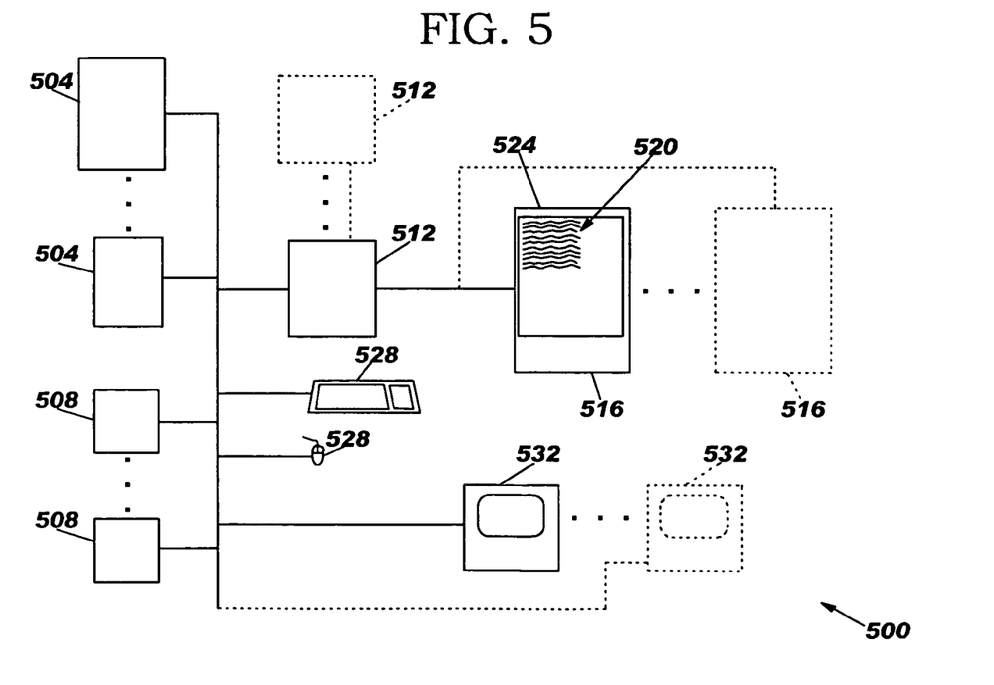
FIG. 5 is a high-level schematic diagram of a computer system of the present invention.

As those skilled in the art will readily appreciate, methods and algorithms of the present invention, such as method 300 and algorithm 400 of FIGS. 3 and 4, respectively, may be implemented in a suitable computer system, such as computer system 500 of FIG. 5, that may be interfaces with fabrication tools 504 and other devices 508. Computer system 500 may include, among other things, one or more processors 512 that accesses one or more memory devices, or computer readable media 516, that stores computer instructions 520 for performing some or all of the various steps of method 300 and algorithm 400. As those skilled in the art will also appreciate, computer instruction may be grouped into one or more program structures 524, such as a standalone application, plug-in modules or new routines or modules for legacy software. Of course, computer system may include other components, such as one or more input devices 528, e.g., keyboard, mouse, digitizer, etc. and one or more display devices 532, among others.

Although the invention has been described and illustrated with respect to an exemplary embodiment thereof, it should be understood by those skilled in the art that the foregoing and various other changes, omissions and additions may be made therein and thereto, without parting from the spirit and scope of the present invention.

What is claimed is:

1. A method of creating a circuit layout based on a plurality of constraints and at least one objective, comprising the steps of:
   (a) constructing a Boolean satisfiability problem containing a plurality of constraints and at least one objective;
   (b) determining if said at least one objective renders said Boolean satisfiability problem unsatisfiable;
   (c) if said at least one objective renders said Boolean satisfiability problem unsatisfiable, removing said at least one objective so as to form a reduced Boolean satisfiability problem, wherein said reduced Boolean satisfiability problem comprises a plurality of variables and the method further comprises: the step of rounding non-integer results of an linear program (LP) based on a truth assignment to said variables of said reduced Boolean satisfiability problem; and
   (d) creating a circuit layout as a function of said reduced Boolean satisfiability problem.

2. A method according to claim 1, wherein said rounding step includes rounding up each of said non-integer results corresponding to a TRUE one of said variables and rounding down each of said non-integer results corresponding to a FALSE one of said variables.

3. A method according to claim 1, wherein step (b) comprises the step of constructing a directed graph.

4. A method according to claim 3, wherein step (b) further comprises determining the strongly connected components of said directed graph.

5. A method according to claim 4, wherein said Boolean satisfiability problem comprises a plurality of variables and step (b) further comprises, after determining strongly connected components of said directed graph, performing a truth assignment to said plurality of variables.

6. A method according to claim 1, further comprising, prior to step (a), the step of solving an linear problem LP comprising said plurality of constraints and said at least one objective so as to obtain a rational solution.

7. A method according to claim 1, wherein said Boolean satisfiability problem comprises a plurality of constraints and a plurality of objectives and step (c) includes removing a subset of said plurality of objectives.

8. A computer readable medium containing computer instructions for creating a circuit layout based on a plurality of constraints and at least one objective, said computer instructions comprising:
   (a) a first set of instructions for constructing a Boolean satisfiability problem containing a plurality of constraints and a plurality of objectives;
   (b) a second set of instructions for determining if at least one of said plurality of objectives renders said Boolean satisfiability problem unsatisfiable;
   (c) a third set of instructions for removing at least one of said plurality of objectives so as to form a reduced Boolean satisfiability problem, wherein said reduced Boolean satisfiability problem comprises a plurality of variables and the computer instructions further include a fifth set of instructions for rounding non-integer results of an linear program (LP) based on a truth assignment to said variables of said reduced Boolean satisfiability problem; and
   (d) a fourth set of instructions for creating a circuit layout as a function of said reduced Boolean satisfiability problem.

9. A computer readable medium according to claim 8, wherein said fifth set of instructions includes instructions for rounding up each of said non-integer results corresponding to a TRUE one of said variables and rounding down each of said non-integer results corresponding to a FALSE one of said variables.

10. A computer readable medium according to claim 8, wherein said second set of instructions includes instructions for constructing a directed graph.

11. A computer readable medium according to claim 10, wherein said second set of instructions further includes instructions for determining the strongly connected components of said directed graph.

12. A system, comprising:
   (a) at least one computer processor; and
   (b) at least one memory device operatively coupled to said at least one computer processor, said at least one memory device containing computer instructions for creating a circuit layout based on a plurality of constraints and a plurality of objectives, said computer instructions comprising:
      (i) a first set of instructions for constructing a Boolean satisfiability problem containing said plurality of constraints and said plurality of objectives;
      (ii) a second set of instructions for determining if any of said plurality of objectives renders said Boolean satisfiability problem unsatisfiable;
      (iii) a third set of instructions for removing said at least one of said plurality of objectives so as to form a reduced Boolean satisfiability problem, wherein said reduced Boolean satisfiability problem comprises a plurality of variables and the computer instructions further include a fifth set of instructions for rounding non-integer results of an linear program (LP) based on a truth assignment to said variables of said reduced Boolean satisfiability problem; and
      (iv) a fourth set of instructions for creating a circuit layout as a function of said reduced Boolean satisfiability problem.

13. A system according to claim 12, wherein said fifth set of instructions includes instructions for rounding up each of said non-integer results corresponding to a TRUE one of said variables and rounding down each of said non-integer results corresponding to a FALSE one of said variables.

14. A system according to claim 12, wherein said second set of instructions includes instructions for constructing a directed graph.

15. A system according to claim 14, wherein said second set of instructions further includes instructions for determining strongly connected components of said directed graph.

16. A system according to claim 12, further comprising at least one fabrication tool operatively connected to said at least one computer processor.

17. A system according to claim 12, further comprising a sixth set of instructions for solving an linear problem LP comprising said plurality of constraints and said plurality of objectives so as to obtain a rational solution.

* * * * *